(12) United States Patent
Miyazaki

(10) Patent No.: US 6,923,861 B2
(45) Date of Patent: Aug. 2, 2005

(54) METHOD OF MANUFACTURING PHOTONIC CRYSTAL

(75) Inventor: Keiichi Miyazaki, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 134 days.

(21) Appl. No.: 10/667,361

(22) Filed: Sep. 23, 2003

(65) Prior Publication Data

US 2004/0055528 A1 Mar. 25, 2004

(30) Foreign Application Priority Data

Sep. 24, 2002 (JP) ........................................ 2002-276867

(51) Int. Cl.⁷ .............................................. C30B 25/04
(52) U.S. Cl. ............................. 117/97; 117/89; 117/95
(58) Field of Search ................................ 117/89, 95, 97

(56) References Cited

U.S. PATENT DOCUMENTS 6,767,676 B2 * 7/2004 Nagao ........................ 430/11

FOREIGN PATENT DOCUMENTS

JP 2001-272566 A 10/2001

\* cited by examiner

*Primary Examiner*—Felisa Hiteshew
(74) *Attorney, Agent, or Firm*—Sughrue Mion, PLLC

(57) ABSTRACT

A photonic crystal manufacturing method exposes two or more silver halide particle layers that contain silver halide particles which have different spectral sensitivity characteristics for each of the silver halide particle layers to light having wavelengths corresponding to the respective different spectral sensitivity characteristics, and then develops the exposed silver halide particle layers to form therein a periodic structure with an aggregate of developed silver. Photonic crystals can be manufactured with relative ease in a relatively short period of time. This method assures continued high accuracy.

9 Claims, 2 Drawing Sheets

METHOD OF MANUFACTURING PHOTONIC CRYSTAL

BACKGROUND OF THE INVENTION

1. Field of the Invention

The present invention relates to a method of manufacturing a photonic crystal that has a structure in which two or more media having different refractive indexes are arranged periodically. In particular, the present invention relates to a method of manufacturing a photonic crystal to which a photographic technology using silver halide is applied.

2. Description of the Related Art

Photonic crystals have their respective artificial multi-dimensional (e.g., two- or three-dimensional) periodic structures that are similar to those of solid crystals, and more particularly, each of the crystals has two or more media having different refractive indexes and being arranged in a periodic manner.

Conventionally, for manufacturing such a photonic crystal that has two or more media having different refractive indexes and being arranged periodically, there are various methods known in the art, such as dry etching, wet etching, fusion and lamination, sputtering, manipulation, self-organization, and lithographic application.

However, each of those conventional methods includes complicated steps and takes a comparatively long time for executing the steps. In particular, no person skilled in the art has known a simple method of manufacturing a two- or three-dimensional photonic crystal. Furthermore, each of those various methods depends on a technology used in the production of a semiconductor. Therefore, there is a problem in that a photonic crystal having a large surface area is difficult to manufacture.

Some of the above conventional methods may be restricted in size or accuracy of a pattern to be created, in order to avoid deterioration in the shape of such a pattern due to an undesired spread of light or a processing solution when an etching method is applied, for example.

In the following description, basic properties and exemplified operations of conventional photonic crystals and, also conventional methods of manufacturing the photonic crystals are omitted because they are described concretely in various prior art documents (e.g., see JP 2001-272566 A).

SUMMARY OF THE INVENTION

The present invention has been completed in view of the above circumstances and aims to solve the above problems in the prior art. Therefore, it is an object of the present invention to provide a method of manufacturing a photonic crystal, in which a photonic crystal can be manufactured with relative ease in a relatively short period of time.

Another object of the present invention is to provide a method of manufacturing a photonic crystal that is capable of assuring continued high accuracy, in addition to the above characteristics.

In order to attain the above objects, according to the present invention, there is provided a method of manufacturing a photonic crystal, comprising the steps of: exposing two or more silver halide particle layers that contain silver halide particles which have different spectral sensitivity characteristics for each of the two or more silver halide particle layers to light having wavelengths corresponding to the respective different spectral sensitivity characteristics; and developing the exposed two or more silver halide particle layers to form a periodic structure with an aggregate of developed silver in the exposed two or more silver halide particle layers.

Furthermore, the different spectral sensitivity characteristics of the silver halide particles may be those inherently possessed by the silver halide particles, or may be those obtained by providing the silver halide particles with sensitizing actions by means of appropriate spectral sensitization, chemical sensitization, or the like. Alternatively, furthermore, the different spectral sensitivities characteristics of the silver halide particles may be those realized by a combination with an appropriate filter taking the above characteristics and spectral absorption characteristics into consideration.

In this case, the filter may be preferably arranged on a silver halide particle layer having a target absorption wavelength.

In the method of manufacturing a photonic crystal in accordance with the present invention, a material having an intermediate layer which contains no silver halide particles and which is formed between two of the two or more silver halide particle layers is preferably used.

Furthermore, the intermediate layer may also serve as the above filter.

In the method of manufacturing a photonic crystal in accordance with the present invention, it is effective in constructing a finer pattern with sufficient accuracy that exposure may be performed using light of a short wavelength of, for instance, 460 nm or less, preferably 440 nm or less, more preferably 400 nm or less. However, the present invention is not limited thereto.

Furthermore, the number of silver halide particle layers in the material for manufacturing a photonic crystal which is used in the method of manufacturing a photonic crystal in accordance with the present invention is not particularly limited as long as the number is equal to or greater than 2.

DETAILED DESCRIPTION OF PREFERRED EMBODIMENTS

Hereinafter, the method of manufacturing a photonic crystal will be described in detail with reference to preferred embodiments shown in the attached drawings.

Figure 1:
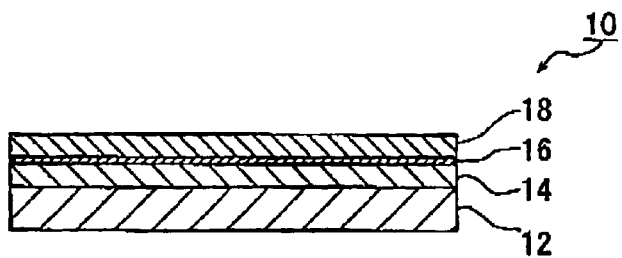
FIG. 1 is a cross-sectional diagram of a material for manufacturing a photonic crystal in accordance with an embodiment of the present invention.

FIG. 1 shows a material for manufacturing a photonic crystal in accordance with an embodiment of the present invention. As shown in the figure, the material 10 includes a substrate 12, two silver halide particle layers 14 and 18 formed on the substrate 12 and a sharp-cut filter (hereinafter, also referred to as an SC filter) 16 provided between the layers 14, 18 to block incident light at a wavelength shorter than a predetermined wavelength.

Concretely, in FIG. 1, the material 10 for manufacturing a photonic crystal includes on the support 12, the lower silver halide particle layer 14, the SC filter layer 16, and the upper silver halide particle layer 18. Here, an appropriate protective layer (not shown) may be additionally formed on the surface of the upper silver halide particle layer 18. In addition, an appropriate intermediate layer or the like may be formed below the lower silver halide particle layer 14.

For instance, the lower silver halide particle layer 14 may be an AgCl particle layer containing 10 mol % of AgBr, and the upper silver halide particle layer 18 may be a pure AgCl particle layer. The SC filter layer 16 may be one showing spectral absorption characteristics with a steep rising at approximately 420 nm as shown in FIG. 2.

Figure 3:
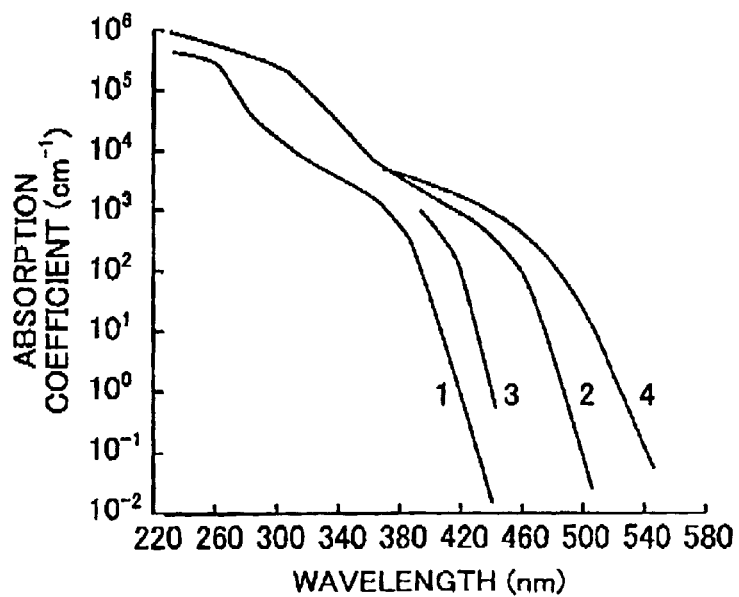
FIG. 3 is a graph schematically illustrating the outlines of optical absorbance spectrums of various silver halide crystals.

FIG. 3 illustrates schematically outlined optical absorbance spectrums of the respective crystals, the above pure AgCl (1), pure AgBr (2), AgCl (3) that contains 10 mol % of AgBr, and AgBr (4) that contains 3 mol % of AgI, respectively. Furthermore, the optical absorbance spectrum of each crystal shows a clear difference of at least 20 nm.

Figure 2:
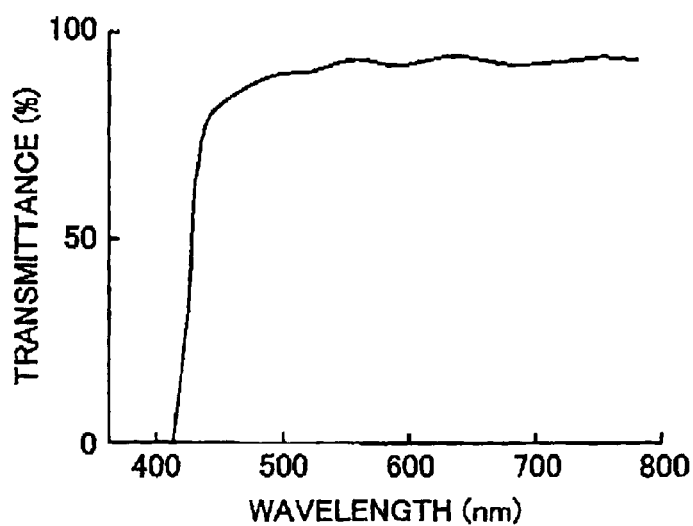
FIG. 2 is a graph that represents an example of the spectral absorption characteristics of an SC filter layer used in the embodiment of the present invention.

As is evident from FIGS. 2 and 3, the material 10 for manufacturing a photonic crystal of this embodiment utilizes spectral absorbance action of the SC filter layer 16, allowing selective exposure of the upper silver halide particle layer 18 (the pure AgCl particle layer) and the lower silver halide particle layer 14 (the AgCl particle layer containing 10 mol % of AgBr).

That is, light at a wavelength of 400 nm is first used to perform exposure for a (predetermined) pattern for forming a photonic crystal. In this exposure, the upper silver halide particle layer 18 is exposed to light and a latent image corresponding to the pattern is formed thereon. In this case, however, the light at a wavelength of 400 nm cannot reach the lower silver particle halide layer 14 (see FIG. 2) because of the presence of the SC filter layer 16 having a steep rising at a position of approximately 420 nm. Therefore, the lower silver halide particle layer 14 cannot be exposed to light.

Subsequently, light at a wavelength of 440 nm is used to perform exposure for another (predetermined) pattern for forming a photonic crystal. In this exposure, the upper silver halide particle layer 18 has no sensitivity to light at that wavelength. Therefore, the lower silver halide particle layer 14 is only exposed to the light having passed through the SC filter layer 16, resulting in the formation of the corresponding latent image.

Figure 4:
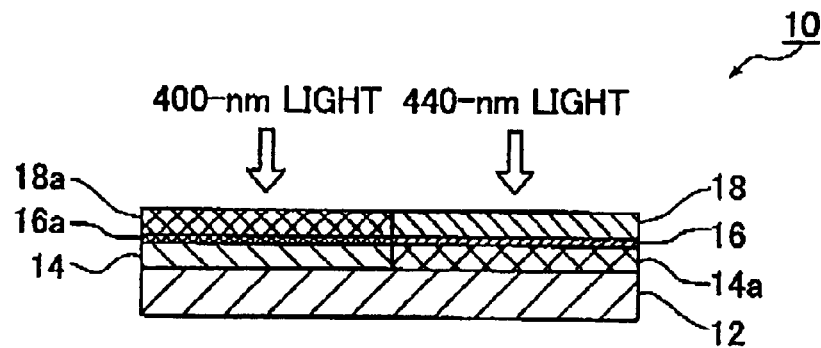
FIG. 4 is a cross-sectional diagram schematically illustrating exposure conditions using the material for manufacturing a photonic crystal shown in FIG. 1.

In FIG. 4, the above situation is schematically illustrated. In this figure, a double-hatching area 18a of the upper silver halide particle layer 18 represents a latent image formed by the exposure to light at a wavelength of 400 nm. A double-hatching area 14a of the lower silver halide particle layer 14 represents a latent image formed by the exposure to light at a wavelength of 440 nm. Furthermore, a double-hatching area 16a of the SC filter layer 16 represents the absorption of light at a wavelength of 400 nm (needless to say, in this area, a substantial change does not necessarily occur).

Here, the developed-silver patterns formed by exposing the upper and lower silver halide particle layers 18 and 14 can be arbitrarily determined. In other words, the size, direction, and so on of the developed-silver patterns formed in those silver halide layers can be arbitrarily determined, allowing the formation of a photonic crystal having different patterns.

In the above embodiment, light of two different wavelengths can be used to expose different silver halide particle layers for different (predetermined) patterns for forming a photonic crystal. Therefore, latent images formed by the exposure can be made visible through development, whereby a photonic pattern with a desired steric structure can be formed in the material 10 for manufacturing a photonic crystal by means of developed silver.

Although it is preferable to remove unexposed silver halide particles in the silver halide particle layer 14 or 18 by fixing process, the unexposed silver halide particles may not be necessarily removed but remain in the layer.

Figure 5:
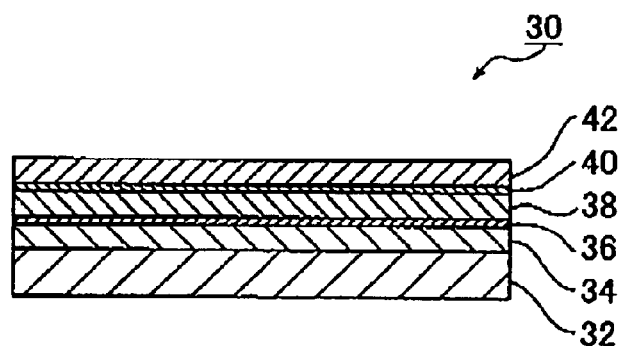
FIG. 5 is a cross-sectional diagram of the material for manufacturing a photonic crystal in accordance with another embodiment of the present invention.

FIG. 5 illustrates a material 30 for manufacturing a photonic crystal in accordance with another embodiment of the present invention. Here, the material 30 includes a substrate 32, three different silver halide particle layers 34, 38, and 42 formed on the substrate 32, and two kinds of SC filter layers 36 and 40 arranged between the silver halide particle layers 34 and 38 and between the silver halide particle layers 38 and 42, for blocking the light at a wavelength shorter than a predetermined one.

Concretely, in FIG. 5, the material 30 for manufacturing a photonic crystal includes on the support 32, the lower silver halide particle layer 34, the first SC filter layer 36, the intermediate silver halide particle layer 38, the second SC filter layer 40, and the upper silver halide particle layer 42. Here, an appropriate protective layer (not shown) may be additionally formed on the surface of the upper silver halide particle layer 42. In addition, an appropriate intermediate layer or the like may be formed in contact with each silver halide particle layer.

For instance, the lower silver halide particle layer 34 may be a pure AgBr particle layer, the intermediate silver halide particle layer 38 may be an AgCl particle layer containing 10 mol % of AgBr, and the upper silver halide particle layer 42 may be a pure AgCl particle layer. Furthermore, each of the first SC filter layer 36 and the second SC filter layer 40 may be one showing spectral absorption characteristics with a steep rising at 420 nm or 460 nm.

Figure 6:
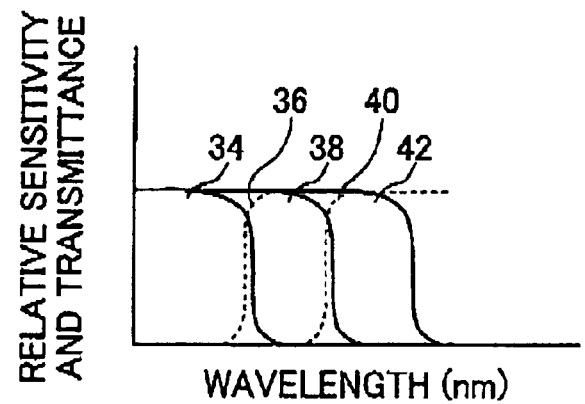
FIG. 6 is a graph schematically illustrating exposure conditions using the material for manufacturing a photonic crystal shown in FIG. 5.

FIG. 6 is a schematic diagram that shows the relationship among the spectral sensitivity of each silver halide particle layer, a rising position of the SC filter layer, and the wavelength of exposure light, with respect to the material 30 for manufacturing a photonic crystal of the present embodiment.

In FIG. 6, with respect to the material 30 for manufacturing a photonic crystal as constructed in FIG. 5, there are schematically represented the relationship among the different situations of the spectral sensitivity regions of the respective silver halide particle layers 34, 38, 42 and the rising positions of the corresponding SC filters (having their characteristics as shown in FIG. 2) used for switching those spectral sensitivity regions.

In other words, when forming a photonic pattern by using the material 30 for manufacturing a photonic crystal shown in this embodiment, at first, light at a wavelength of 400 nm is used to expose for a (predetermined) pattern for manufacturing a photonic crystal.

The upper silver halide particle layer 42 is exposed to form a corresponding latent image. In this case, however, the light at a wavelength of 400 nm does not reach the other layers below the upper silver halide particle layer 42 because of the presence of the second SC filter layer 40 having a steep rising at a position of about 420 nm in wavelength (see FIG. 2). Therefore, the silver halide particle layers 38 and 34 below the layer 42 are not exposed to light.

Next, light at a wavelength of 440 nm is used to perform exposure for another (predetermined) pattern for manufacturing a photonic crystal. In this exposure, the intermediate silver halide particle layer 38 having sensitivity to light at 440 nm in wavelength is exposed because of the following reasons. That is, the upper silver halide particle layer 42 has no sensitivity to the light at 440 nm, and the light at 440 nm in wavelength cannot reach the lower silver halide particle layer 34 because of the presence of the first SC filter layer 36 having a steep rising at a position of about 460 nm. Therefore, the lower silver halide particle layer 34 cannot be exposed.

Finally, light at a wavelength of 480 nm is used to perform exposure for still another (predetermined) pattern for manufacturing a photonic crystal, which is different from the two patterns described above. The lower silver halide particle layer 34 having sensitivity to light at 480 nm is exposed because the upper and intermediate silver halide particle layers 42 and 38 are not sensitive to light at 480 nm.

In the above embodiment, light with three different wavelengths is used to expose three different silver halide particle layers to form three different (predetermined) patterns for manufacturing a photonic crystal. Therefore, latent images formed by the exposure can be made visible through development, whereby a photonic pattern with a desired steric structure can be formed in the material 30 for manufacturing a photonic crystal by means of developed silver.

Preferably, furthermore, unexposed silver halide particles in the silver halide particle layer 14 or 18 are removed by the fixing process. As described above, however, those particles may not be necessarily removed but remain in the layer.

The method of manufacturing a photonic crystal having a desired steric structure by using a material for manufacturing a photonic crystal which includes two or three silver halide particle layers having different spectral sensitivities has been described in the foregoing pages. However, the same method can be used to manufacture a photonic crystal of a steric structure having more layers by further increasing the number of silver halide particle layers having different spectral sensitivities and combining the increased silver halide particle layers with corresponding SC filter layers appropriately selected.

That is, each of the above embodiments is described as an example of the present invention. Thus, it is needless to say that the invention should not be restricted to those embodiments and may be appropriately modified or changed without departing from the gist of the present invention.

For instance, as described above, silver halide particles having intrinsic sensitivities and silver halide particles being provided with sensitized action by means of appropriate spectral sensitization, chemical sensitization, or the like can be used in the present invention for the silver halide particle layer in the material for manufacturing a photonic crystal.

As described above in detail, the present invention produces a significant effect of realizing the method of manufacturing a photonic crystal, allowing the production of the photonic crystal with relative ease in a relatively short period of time. In addition, the present invention produces a significant effect of realizing the method of manufacturing a photonic crystal that is capable of assuring continued high accuracy.

More concretely, a highly accurate photonic crystal can be manufactured by the application of photographic technology by means of a combination between two or more silver halide particle layers having different spectral sensitivity regions and SC filters corresponding to each of the spectral sensitivity regions of the two or more silver halide particle layers which allow exposure to light of different wavelengths using the difference in spectral sensitivity of those silver halide particle layers.

What is claimed is:

1. A method of manufacturing a photonic crystal comprising the steps of:

exposing two or more silver halide particle layers that contain silver halide particles which have different spectral sensitivity characteristics for each of said two or more silver halide particle layers to light having wavelengths corresponding to said different spectral sensitivity characteristics, respectively; and developing the thus exposed two or more silver halide particle layers to form a periodic structure with an aggregate of developed silver in said exposed two or more silver halide particle layers.

2. The method according to claim 1, wherein said different spectral sensitivity characteristics of said silver halide particles is one kind of characteristics inherently possessed by said silver halide particles and characteristics obtained by providing said silver halide particles with sensitizing actions by means of spectral sensitization or chemical sensitization.

3. The method according to claim 1, wherein said different spectral sensitivity characteristics of said silver halide particles is characteristics realized by a combination with an filter taking into consideration spectral absorption characteristics and one kind of characteristics inherently possessed by said silver halide particles and characteristics obtained by providing said silver halide particles with sensitizing actions by means of spectral sensitization or chemical sensitization.

4. The method according to claim 3, wherein said filter is arranged on a silver halide particle layer having a target absorption wavelength in said two or more silver halide particle layers.

5. The method according to claim 3, wherein a material having an intermediate layer which contains no silver halide particles and which is formed between two of said two or more silver halide particle layers is used and said intermediate layer serve as said filter.

6. The method according to claim 1, wherein a material having an intermediate layer which contains no silver halide particles and which is formed between two of said two or more silver halide particle layers is used.

7. The method according to claim 1, wherein said light is light of a short wavelength of 460 nm or less.

8. The method according to claim 1, wherein said light is light of a short wavelength of 440 nm or less.

9. The method according to claim 1, wherein said light is light of a short wavelength of 400 nm or less.

* * * * *